(12) United States Patent
Chen et al.

(10) Patent No.: US 10,921,070 B2
(45) Date of Patent: Feb. 16, 2021

(54) CONNECTOR ASSEMBLY FOR LIQUID COOLING

(71) Applicant: QUANTA COMPUTER INC., Taoyuan (TW)

(72) Inventors: Chao-Jung Chen, Taoyuan (TW); Chih-Hsiang Lee, Taoyuan (TW); Chih-Ming Chen, Taoyuan (TW); Yen-Yu Liu, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 60 days.

(21) Appl. No.: 16/295,883

(22) Filed: Mar. 7, 2019

(65) Prior Publication Data
US 2020/0191504 A1 Jun. 18, 2020

Related U.S. Application Data

(60) Provisional application No. 62/779,845, filed on Dec. 14, 2018.

(51) Int. Cl.
*F28F 7/00* (2006.01)
*F28F 9/02* (2006.01)
(Continued)

(52) U.S. Cl.
CPC ......... *F28F 9/0258* (2013.01); *H05K 7/1489* (2013.01); *H05K 7/20272* (2013.01); *H05K 7/20781* (2013.01)

(58) Field of Classification Search
CPC . F28F 9/0258; H05K 7/1489; H05K 7/20272; H05K 7/20781
(Continued)

(56) References Cited

U.S. PATENT DOCUMENTS 4,289,295 A * 9/1981 Allread ............... F16L 29/02
251/149.2
2004/0008483 A1 1/2004 Cheon
(Continued)

FOREIGN PATENT DOCUMENTS

JP 2005326141 A 11/2005
JP 2009273515 A 11/2009
(Continued)

OTHER PUBLICATIONS

Extended European Search Report for EP Application No. 19185413.2, dated Jan. 2, 2020.
(Continued)

*Primary Examiner* — Davis D Hwu
(74) *Attorney, Agent, or Firm* — Nixon Peabody LLP (57) ABSTRACT

The present disclosure describes a connector assembly for a liquid manifold within a server rack. The connector assembly includes a pipe configured to connect to the liquid manifold. The pipe has a flexible portion configured to accommodate at least one of lateral or vertical manipulation of the pipe while the pipe remains connected to the liquid manifold. The connector assembly further includes a first connector and a second connector configured to form a liquid-tight connection when coupled together. One of the first connector and the second connector is connected to a distal end of the pipe. The other of the first connector and the second connector is configured to connect to a component within the server rack, for supplying coolant from the liquid manifold to the component.

22 Claims, 8 Drawing Sheets

(51) Int. Cl.
*H05K 7/14* (2006.01)
*H05K 7/20* (2006.01)

(58) Field of Classification Search
USPC ........................................................ 165/80.4
See application file for complete search history.

(56) References Cited

U.S. PATENT DOCUMENTS

| | | |
|---|---|---|
| 2005/0241799 A1 | 11/2005 | Malone et al. |
| 2014/0240920 A1 | 8/2014 | Cox et al. |
| 2015/0237767 A1 | 8/2015 | Shedd et al. |
| 2016/0066480 A1 | 3/2016 | Eckberg et al. |
| 2016/0242318 A1 | 8/2016 | Krug, Jr. et al. |
| 2016/0242326 A1 | 8/2016 | Edwards et al. |
| 2017/0181328 A1* | 6/2017 | Shelnutt ............ H05K 7/20781 |
| 2017/0332520 A1 | 11/2017 | Eriksen |
| 2018/0242478 A1* | 8/2018 | Cui ..................... H05K 7/1489 |
| 2018/0303007 A1* | 10/2018 | Gao ................... H05K 7/20272 |
| 2019/0223323 A1 | 7/2019 | Wu et al. |

FOREIGN PATENT DOCUMENTS

| | | |
|---|---|---|
| JP | 2013169468 A | 9/2013 |
| JP | 2018517106 A | 6/2018 |
| TW | 204391 B | 4/1993 |
| TW | 201221039 A | 5/2012 |
| TW | 201305476 A | 2/2013 |
| TW | 201347657 A | 11/2013 |
| TW | 201703403 A | 1/2017 |
| TW | 201703625 A | 1/2017 |
| WO | 2018045761 A1 | 3/2018 |

OTHER PUBLICATIONS

TW Office Action for Application No. 108120161, dated Jan. 9, 2020, w/ First Office Action Summary.
TW Search Report for Application No. 108120161, dated Jan. 9, 2020, w/ First Office Action.
JP Office Action for Application No. 2019-164042, dated Nov. 10, 2020, w/ First Office Action Summary.

* cited by examiner

FIG. 5B

CONNECTOR ASSEMBLY FOR LIQUID COOLING

CROSS-REFERENCE TO RELATED APPLICATION

This application claims priority under 35 U.S.C. § 119 to U.S. Provisional Application No. 62/779,845, entitled "RACK FLOATING LIQUID COOLING QUICK DOCKING DESIGN," and filed on Dec. 14, 2018. The contents of that application are hereby incorporated by reference in their entirety.

FIELD OF THE INVENTION

The present invention applies to liquid cooling systems for computer systems and more specifically, to a connector assembly that accounts for tolerances in connecting components to a liquid cooling system.

BACKGROUND

The rapid development of server computer systems has increased the requirements on associated computer cooling systems. The increased energy requirements have resulted in increased heat dissipation requirements. Conventional air cooling systems are not able to accommodate the increased heat dissipation requirements. As a result, server computer systems have begun to use liquid cooling systems for overcoming the deficiencies of air cooling systems. However, the requirement of having a closed liquid circuit presents certain issues.

One issue is the need to connect and disconnect each server computer system to the liquid circuit. Connecting or disconnecting a server computer system from the server rack requires the connection or disconnection of each connection of the server computer system to the liquid circuit, which can be time consuming and also expose the server rack to potential damage through leaks. Current connectors used within liquid cooling systems increase the chance for a leak by being unable to cope with the cumulative tolerances of multiple components within the liquid circuit. The result can be leaks at the connection points, which can damage the server rack and other internal components.

Accordingly, there is a need for a way to quickly connect and disconnect a server computer system to a fluid circuit while accommodating the cumulative tolerances, and minimizing leaks within the liquid circuit.

SUMMARY

The present disclosure describes a server rack that contains a liquid cooling manifold. The manifold includes connector assemblies that fluidly connect components of the server rack to the liquid cooling manifold. At least portions of the connector assemblies are flexible to accommodate connection to, and movement of, the components connected to the liquid cooling manifold through the connector assemblies. The flexible portions accommodate the cumulative tolerances of the components within the server rack and prevent or prohibit leaks of the liquid coolant at connections.

According to one embodiment of the present disclosure, a connector assembly for a liquid manifold within a server rack is disclosed. The connector assembly includes a pipe configured to connect to the liquid manifold. The pipe has a flexible portion configured to accommodate at least one of lateral or vertical manipulation of the pipe while the pipe remains connected to the liquid manifold. The connector assembly also includes a first connector and a second connector configured to form a liquid-tight connection when coupled together. One of the first connector and the second connector is connected to a distal end of the pipe. The other of the first connector and the second connector is configured to connect to a component within the server rack, for supplying liquid coolant from the liquid manifold to the component.

According to further aspects of the embodiment, a proximal end of the pipe can be a straight portion that connects the pipe to the liquid manifold, and the flexible portion can be at the distal end of the pipe. Alternatively, the distal end of the pipe can be a straight portion that connects the pipe to the one of the first connector and the second connector, and the flexible portion can be proximal to the distal end of the pipe. In some embodiments, the pipe can include a first straight portion and a second straight portion. The first straight portion can connect the pipe to the liquid manifold, and the second straight portion can connect the pipe to the one of the first connector and the second connector at the distal end of the pipe. The flexible portion can be between the first straight portion and the second straight portion. At least one of the first connector or the second connector can be configured to self-seal when disconnected. The first connector can be a female-type connector, and the second connector can be a male-type connector. The second connector can be connected to the distal end of the pipe, and the first connector can be configured to connect to the component of the server rack. The first connector can be connected to the distal end of the pipe, and the component can be a sled of the server rack configured to retain a server computer system. The pipe can be configured to extend perpendicularly away from the liquid manifold and parallel to an insertion direction of the component within the server rack.

According to another embodiment of the present disclosure, a server rack for housing a server computer system is disclosed. The server rack includes a rack frame having a slot, and a sled configured to retain the server computer system and be inserted into the slot. The sled has a dock configured to fluidly connect to the server computer system. The server rack further includes a liquid cooling manifold system extending a height of the rack frame. The liquid cooling manifold system has a first liquid manifold and a second liquid manifold. The server rack further includes a first connector assembly being connected to the first liquid manifold and a second connector assembly being connected to the second liquid manifold. Each of the first connector assembly and the second connector assembly has a pipe configured to connect to the respective liquid manifold. The pipe has a flexible portion configured to accommodate at least one of lateral or vertical manipulation of the pipe while the pipe remains connected to the respective liquid manifold. Each of the first connector assembly and the second connector assembly further includes a first connector and a second connector configured to form a liquid-tight connection when coupled together. One of the first connector and the second connector can be connected to a distal end of the pipe, and the other of the first connector and the second connector can be connected to the dock. The sled can be inserted into the slot, which causes the first connectors to couple with the second connectors, and form a liquid-tight connection to fluidly connect the dock to the liquid cooling manifold system.

According to further aspects of the embodiment, the at least one of the first connector or the second connector can be configured to self-seal when disconnected. For example, the one of the first connector and the second connector connected to the distal end of the pipe can be configured to self-seal when decoupled. The flexible portion can be configured to accommodate lateral, vertical, and longitudinal manipulation of the pipe, while the pipe remains connected to the respective liquid manifold. The first liquid manifold and the second liquid manifold can be on opposite sides of the rack frame. The first connector assembly and the second connector assembly can be horizontally aligned with the slot. The rack frame can have a plurality of the slot, and the liquid cooling manifold system can have a plurality of the first connector assembly and a plurality of the second connector assembly along the length of the rack frame. Pairs of the first connector assembly and the second connector assembly can be horizontally aligned with a separate slot of the plurality of the slot. The pipes of the first connector assembly and the second connector assembly can extend perpendicularly away from the first liquid manifold and the second liquid manifold, and can be parallel to the slot. The pipe can be configured to disconnect from the respective liquid manifold.

According to another embodiment of the present disclosure, a server rack for housing a component is disclosed. The server rack includes a rack frame having a slot, and a liquid cooling manifold system extending a height of the rack frame. The liquid cooling manifold system has a first liquid manifold and a second liquid manifold. The rack frame further includes a first connector assembly connected to the first liquid manifold and a second connector assembly connected to the second liquid manifold. Each of the first connector assembly and the second connector assembly has a pipe configured to connect to the respective liquid manifold. The pipe has a flexible portion configured to accommodate at least one of lateral or vertical manipulation of the pipe, while the pipe remains connected to the respective liquid manifold. Each of the first connector assembly and the second connector assembly also has a first connector connected to a distal end of the pipe. The first connector can be configured to form a liquid-tight connection when coupled to a second connector attached to the component. The component being inserted into the slot causes the first connectors to couple with the second connectors. Connection of the first connectors to the second connectors forms a liquid-tight connection to fluidly connect the component to the liquid cooling manifold system.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments and are, therefore, not to be considered as limitations on the scope of the various embodiments or claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" refer to any electronically-powered or battery-powered equipment that has hardware, software, and/or firmware components, where the software and/or firmware components can be configured for operating features on the device. The term "operating environment" can refer to any operating system or environment that functions to allow software to run on a computer system.

The present disclosure describes a server rack that contains a liquid cooling manifold with connector assemblies. The connector assemblies are used to fluidly connect components, such as server computer systems, to a liquid cooling system associated with the server rack. The connector assemblies include a portion that flexible to accommodate connection to, and movement of, the components connected to the liquid cooling manifold through the connector assemblies. In other words, the flexible portions accommodate the cumulative tolerances of the components within the server rack and prevent or prohibit leaks of the liquid coolant at connections.

Figure 1:
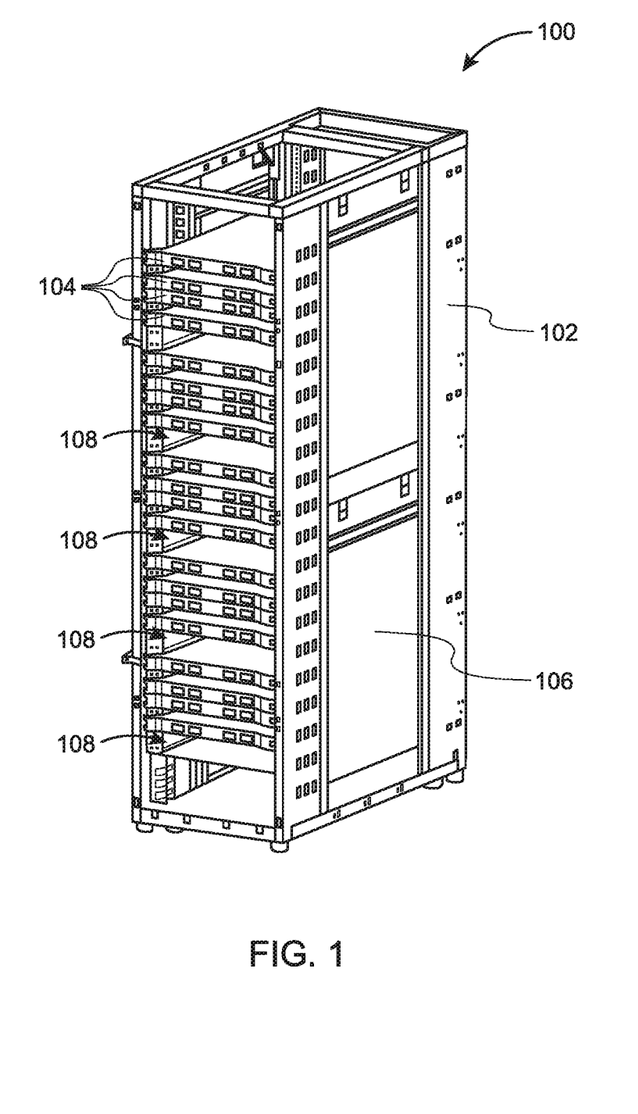
FIG. 1 illustrates a perspective view of a server rack, according to one embodiment of the present disclosure.

FIG. 1 illustrates a perspective view of a server rack 100, according to one embodiment of the present disclosure. The server rack 100 can be any conventional rack that can house one or more computer systems, such as one or more server component systems. For example, the server rack 100 can be a blade server rack for holding one or more blade server computer systems.

The server rack 100 includes a housing 102. The housing 102 surrounds and partially encloses a rack frame 106. The rack frame 106 includes or defines slots 108 that hold one or more components 104 within the server rack 100. In one or more embodiments, the one or more components 104 can be server computer systems. However, the one or more components can be any component found within a server rack. Further, the rack frame 106 can hold other components, such as the components that form, or at least partially form, a liquid cooling system (not shown), such as a pump, a compressor, etc. However, the components of the liquid cooling system, other than the manifolds described below, can be arranged in the server rack 100 according to conventional techniques.

Each slot 108 can hold a single component 104, or multiple slots 108 can hold a single component 104, depending on the sizes of the component 104 and the slots 108. The slots 108 are arranged vertically above each other in a single column. However, in one or more embodiments, the rack frame 106 can instead have a plurality of slots 108 arranged horizontally relative to each other, or combinations thereof; such as more than one column of slots 108.

Figure 2:
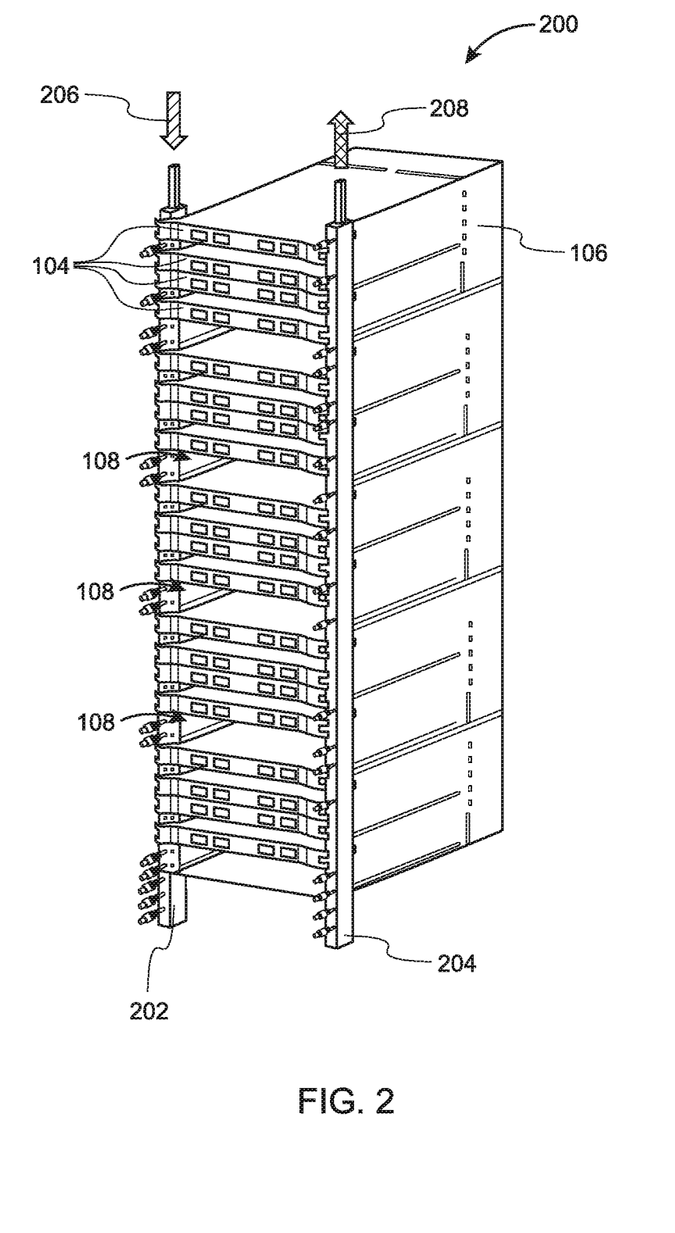
FIG. 2 illustrates a perspective view of the components and liquid cooling manifold of the server rack of FIG. 1, according to one embodiment of the present disclosure.

FIG. 2 illustrates a perspective view of the server rack 100 of FIG. 1 with the housing 102 removed, according to one embodiment of the present disclosure. The server rack 100 includes a liquid cooling manifold system 200. Specifically, the liquid cooling manifold system 200 provides the liquid coolant of the liquid cooling system to the components 104 within the rack frame 106, for dissipating heat from within the components 104. As described above, the liquid cooling manifold system 200 is connected to other components of the liquid cooling system, such as the pump, compressor, heat exchanger, and the like, for cooling and supplying the liquid coolant. These can be contained within the rack frame 106 or server rack 100, or outside of the server rack 100 (not shown in FIG. 2).

The liquid cooling manifold system 200 includes a first liquid manifold 202 and a second liquid manifold 204. One of the first liquid manifold 202 or the second liquid manifold supplies cool liquid coolant to the components 104, and the other of the first liquid manifold 202 and the second liquid manifold 204 receives the hot liquid coolant after dissipation of the heat from within the components 104. By way of example, and as illustrated in FIG. 2, arrow 206 illustrates the cool liquid coolant flowing into the first liquid manifold 202. Arrow 208 illustrates the hot liquid coolant exiting the second liquid manifold 204, after dissipating heat from within the components 104. The supply of the liquid coolant to the components is further discussed below.

Although illustrated as being on opposite sides of the rack frame 106, in one or more embodiments, the first liquid manifold 202 and the second liquid manifold 204 can be on the same side of the rack frame 106, such as both at the front left or front right corner of the rack frame 106.

Figure 3:
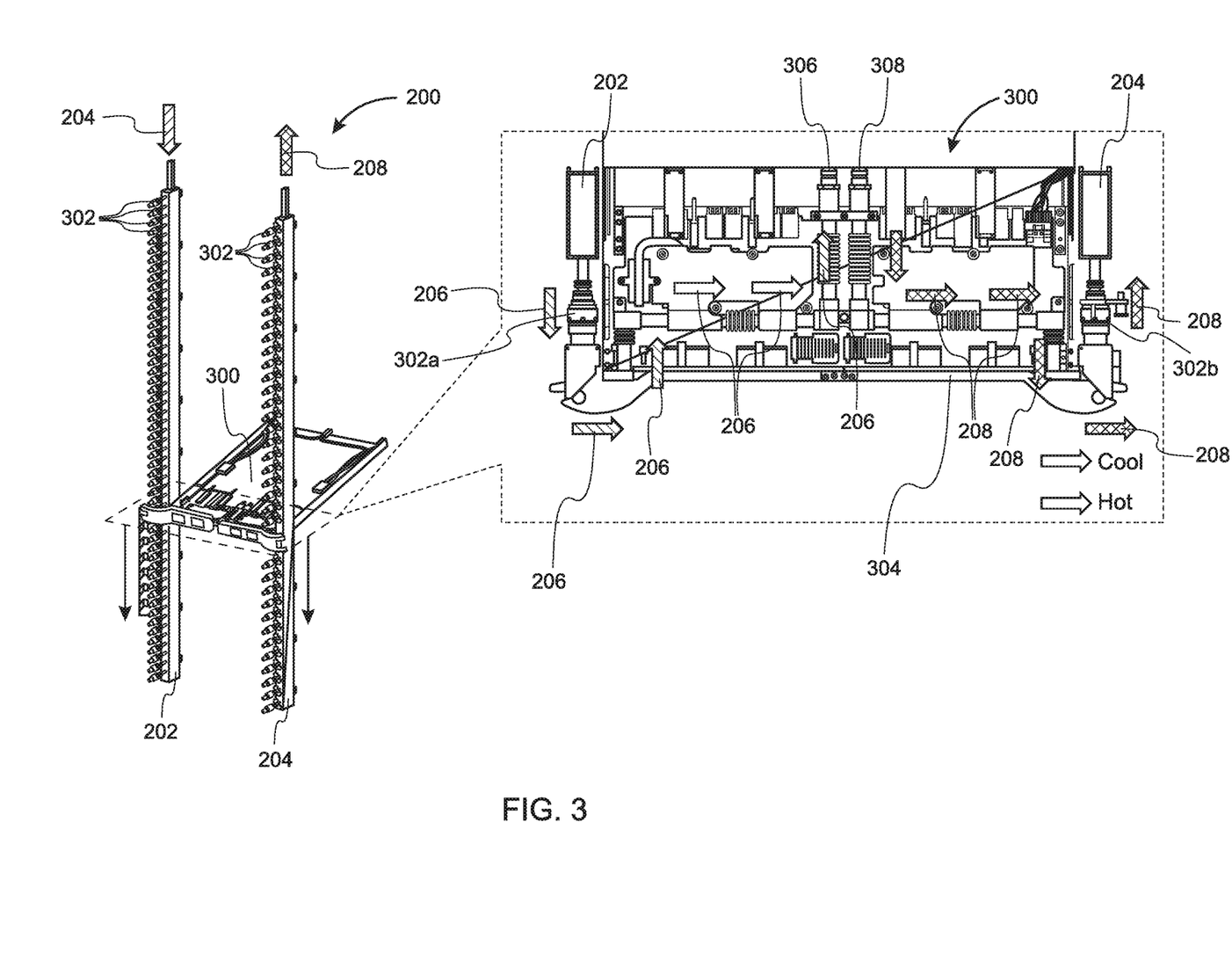
FIG. 3 illustrates a perspective view of a liquid cooling manifold connected to a single component, according to one embodiment of the present disclosure.

FIG. 3 illustrates a perspective view of the liquid cooling manifold system 200 connected to a component, according to one embodiment of the present disclosure. In the illustrated embodiment, the component is specifically a sled 300 that can hold a server computer system (not illustrated). However, any component 104 (FIG. 2) can be used in place of the sled 300, such as the server computer system itself. The sled 300 slides into one of the slots 108 (FIG. 2) defined by the rack frame 106 (FIG. 2), as described above.

Referring to the blow-up portion of FIG. 3, the sled 300 can include a dock 304. As further discussed below, the dock 304 is the connection of the sled 300 to the first liquid manifold 202 and the second liquid manifold 204. The dock 304 is also the connection of the sled 300 to the computer server system.

As shown in the perspective view and the blow-up view of FIG. 3, the first liquid manifold 202 and the second liquid manifold 204 of the liquid cooling manifold system 200 include a plurality of connector assemblies 302. The connector assemblies 302 are positioned along the lengths of the first liquid manifold 202 and the second liquid manifold 204. In one or more specific embodiments, the connector assemblies 302 are positioned along the first liquid manifold 202 and the second liquid manifold 204. Pairs of the connector assemblies 302 are horizontally aligned with slots 108 (FIG. 2) and components 104 inserted within the slots 108.

As shown in the blow-up view of FIG. 3, the dock 304 is connected to the first liquid manifold 202 and the second liquid manifold 204 through the connector assemblies 302a and 302b. Specifically, the connector assembly 302a connects the dock 304 to the first liquid manifold 202, and the connector assembly 302b connects the dock 304 to the second liquid manifold 204. The arrows 206 illustrate the direction the liquid coolant flows from the first liquid manifold 202, through the connector assembly 302a, and into the dock 304 of the sled 300. Within the dock 304 of the sled 300, the liquid coolant travels to an outlet port 306, where the liquid coolant flows into, for example, a server computer system (or any element to be cooled; not shown) retained by the sled 300. The arrows 208 illustrate how, once through the server computer system, after dissipating the heat, the hot liquid coolant flows back into the dock 304 through an inlet port 308. The liquid coolant then flows through the dock 304 to the connector assembly 302b and into the second liquid manifold 204.

Figure 4A:
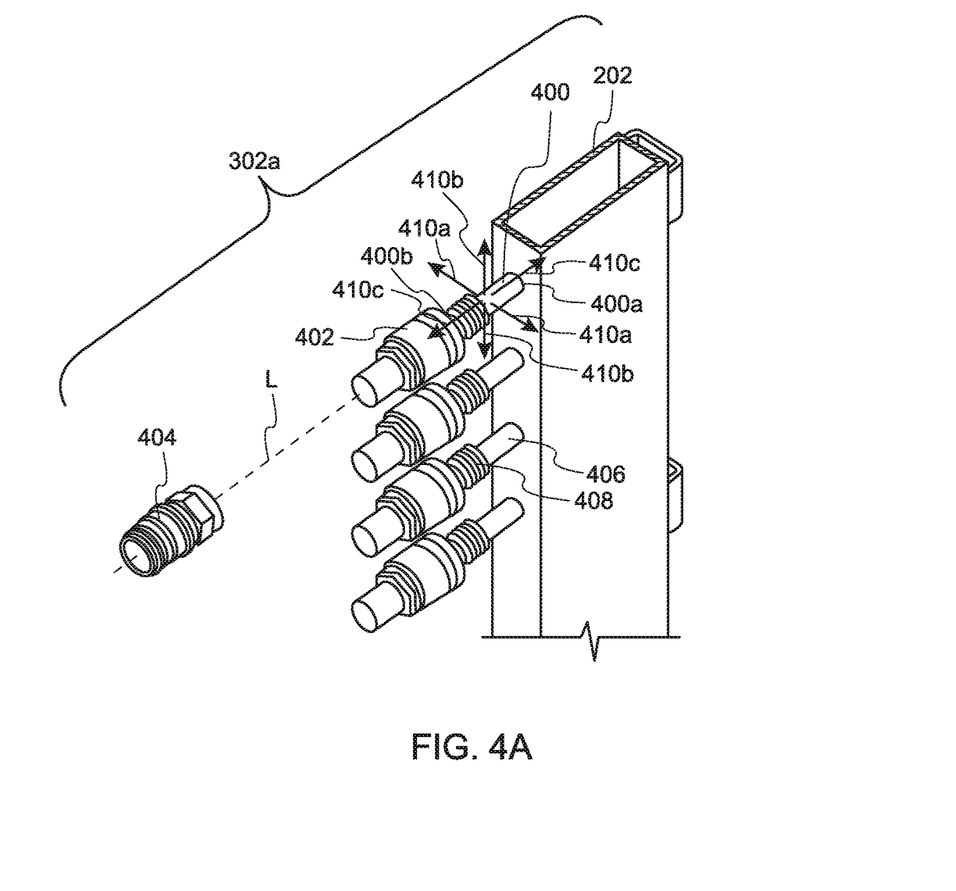
FIG. 4A illustrates a perspective view of a connector assembly connected to a liquid cooling manifold, according to one embodiment of the present disclosure.

FIG. 4A illustrates a perspective view of elements of the connector assemblies, using the connector assembly 302a connected to the first liquid manifold 202 for illustrative purposes, according to one embodiment of the present disclosure. The connector assembly 302a includes a pipe 400, a first connector 402, and a second connector 404. The proximal end 400a of the pipe 400 connects to the first liquid manifold 202, and the distal end 400b of the pipe connects to the first connector 402.

The pipe 400 is generally straight and connects to the first liquid manifold 202. The pipe 400 is perpendicular to the first liquid manifold 202, and extends parallel to a corresponding slot 108 (FIG. 2) within the rack frame 106, as illustrated by the dashed line L. The pipe 400 can be any length. However, to conserve space, the pipe 400 is generally short, such as about half or less of the length of the connector assembly 302. In one or more embodiments, the pipe 400 can be configured to disconnect from the first liquid manifold 202. Alternatively, the pipe 400 can be formed integral to, or monolithic with, the first liquid manifold 202. For example, in one or more embodiments, the pipe 400 can be welded to the first liquid manifold 202.

The pipe 400 can include a straight portion 406 and a flexible portion 408. The flexible portion 408 is configured to flex in one or more directions. In one or more embodiments, the flexible portion 408 is configured to flex based on the material it is formed of, its shape or geometry, or a combination thereof. For example, the flexible portion 408 can be made of a material (e.g., polymeric material) that allows it to flex without breaking or forming a leak. The flexible portion 408 may alternatively, or in addition, have a shape or geometry, such as the illustrated wave wrinkle shape, that allows it to flex.

In one or more embodiments, the flexible portion 408 is configured to flex laterally, vertically, longitudinally, or a combination thereof. For example, the diverging arrows 410a illustrate how the flexible portion 408 can flex laterally (e.g., left/right). The diverging arrows 410b illustrate how the flexible portion 408 can flex vertically (e.g., up/down). The diverging arrows 410c illustrate how the flexible portion 408 can flex longitudinally (e.g., backwards/forwards).

Referring back to the straight portion 406, in one or more embodiments, the straight portion 406 can have the same rigidity as the flexible portion 408, or can be more rigid than the flexible portion 408. Further, as illustrated, the straight portion 406 connects the pipe 400 to the first liquid manifold 202. However, in one or more embodiments, the flexible portion 408 can instead connect directly to the first liquid manifold 202. In one or more embodiments, the pipe 400 can lack the straight portion 406 and be only the flexible portion 408. In one or more embodiments, the pipe 400 can include two straight portions 406 with the flexible portion 408 in the middle.

As illustrated in FIG. 4A, the distal end 400b of the pipe 400 is connected to the first connector 402. Although illustrated as a male connector, the first connector 402 can be any type of connector for making a liquid-tight connection within a liquid circuit of a liquid cooling system. Thus, illustration of the first connector 402 as a male connector is for illustrative purposes only and is not meant to be limiting. The first connector 402 is configured to couple to the second connector 404.

In one or more embodiments, the first connector 402 can be decoupled from the pipe 400. For example, the first connector 402 can be decoupled from the pipe 400 to connect a different connector to the pipe 400. In one or more embodiments, the first connector 402 can be permanently connected to the pipe 400, such as by being welded to the pipe 400.

Similar to above, although illustrated as a female connector, the second connector 404 can be any type of connector for making a liquid-tight connection within a liquid circuit of a liquid cooling system. Thus, illustration of the second connector 404 as a female connector is for illustrative purposes only and is not meant to be limiting.

In one or more embodiments, one or both of the first connector 402 and the second connector 404 can be configured to seal when not coupled together. This prevents or minimizes fluid leaks from the first connector 402 or the second connector 404 when not coupled together. One or both of the first connector 402 and the second connector 404 can include seals that activate when the first connector 402 and the second connector 404 are disengaged. In one or more embodiments, one or both of the first connector 402 and the second connector 404 can include seals that activate when the first connector 402 and the second connector 404 are engaged.

The second connector 404 is configured to be connected to a component 104 within the server rack 100. In one or more embodiments, discussed above with respect to FIG. 3, the second connector 404 is configured to be connected to the dock 304 of the sled 300. Alternatively, or additionally, the second connector 404 can be configured to connect to any component 104 that can be within the server rack 100, such as to a server computer system that is configured to connect to a liquid circuit of a liquid cooling system without the use of the sled 300.

Figure 4B:
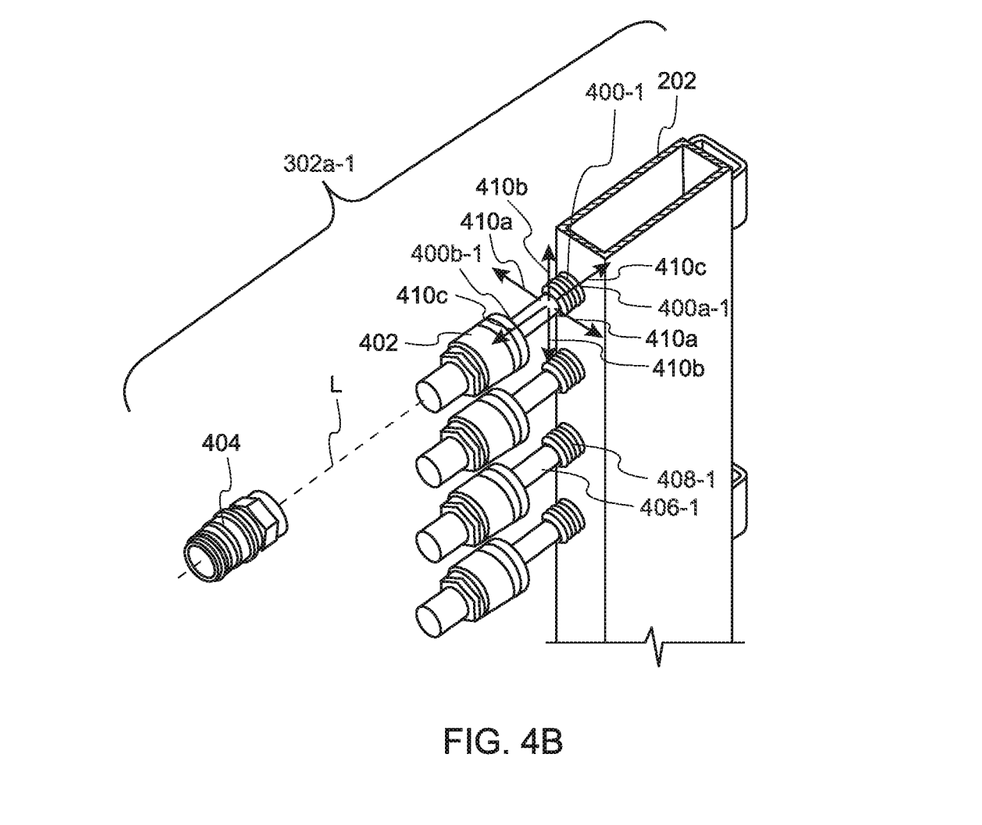
FIG. 4B illustrates a perspective view of another connector assembly connected to a liquid cooling manifold, according to one embodiment of the present disclosure.

FIG. 4B illustrates a perspective view of the components of an alternative connector assembly 302a-1 connected to the first liquid manifold 202, according to one embodiment of the present disclosure. The connector assembly 302a-1 is similar to the connector assembly 302 (FIGS. 3 and 4A) except that the pipe 400-1 includes the flexible portion 408-1 at the proximal end 400a-1 connected to the first liquid manifold 202. The straight portion 406-1 is at the distal end 400b-1 of the pipe 400-1 connected to the first connector 402.

Figure 4C:
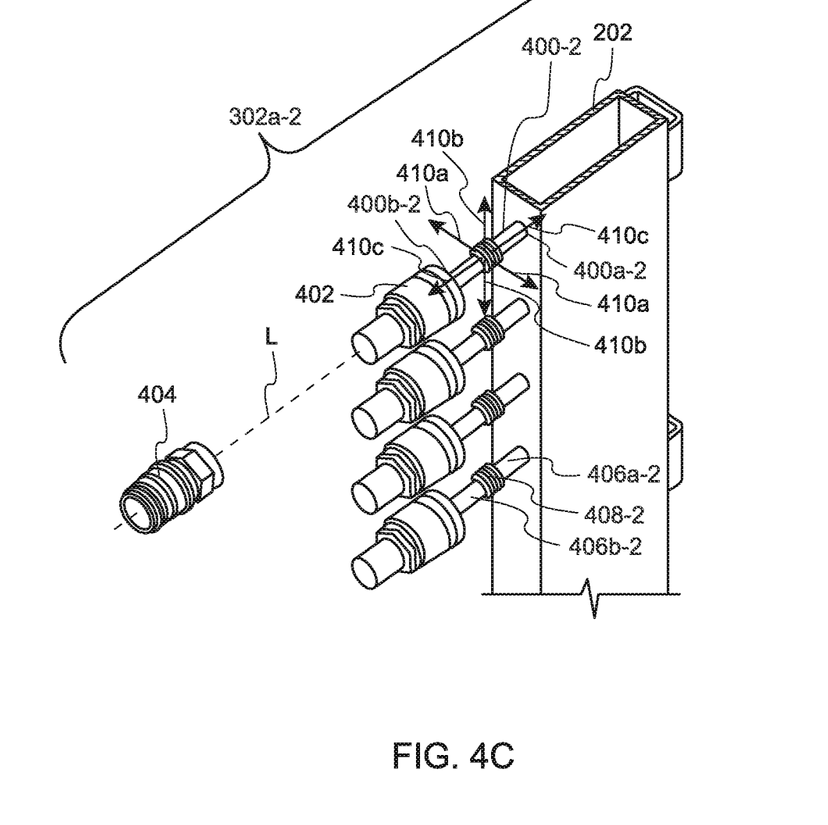
FIG. 4C illustrates a perspective view of another connector assembly connected to the liquid cooling manifold, according to one embodiment of the present disclosure.

FIG. 4C illustrates a perspective view of the components of another alternative connector assembly 302a-2 connected to the first liquid manifold 202, according to one embodiment of the present disclosure. The connector assembly 302a-2 is similar to the connector assembly 302 (FIGS. 3 and 4A) except that the pipe 400-2 includes a first straight portion 406a-2 and a second straight portion 406b-2. The first straight portion 406a-2 connects the pipe 400-2 to the first liquid manifold 202. The second straight portion 406b-2 connects the pipe 400-2 to the first connector 402 at the distal end 400b-2 of the pipe 400-2. Further, the flexible portion 408-2 is between the first straight portion 406a-2 and the second straight portion 406b-2.

In one or more embodiments, the flexible portion 408-2 can be permanently fixed to the first straight portion 406a-2, the second straight portion 406b-2, or both. In one or more embodiments, the flexible portion 408-2 can be configured to detach from the first straight portion 406a-2, the second straight portion 406b-2, or both.

In one or more embodiments, the first straight portion 406a-2, the second straight portion 406b-2, or both can be permanently fixed to the first connector 402 and the liquid manifold 202, respectively; such as by being welded or formed as integral pieces. In one or more embodiments, the first straight portion 406a-2, the second straight portion 406b-2, or both can be configured to be detached from the first connector 402 and the first liquid manifold 202, respectively.

Figure 4D:
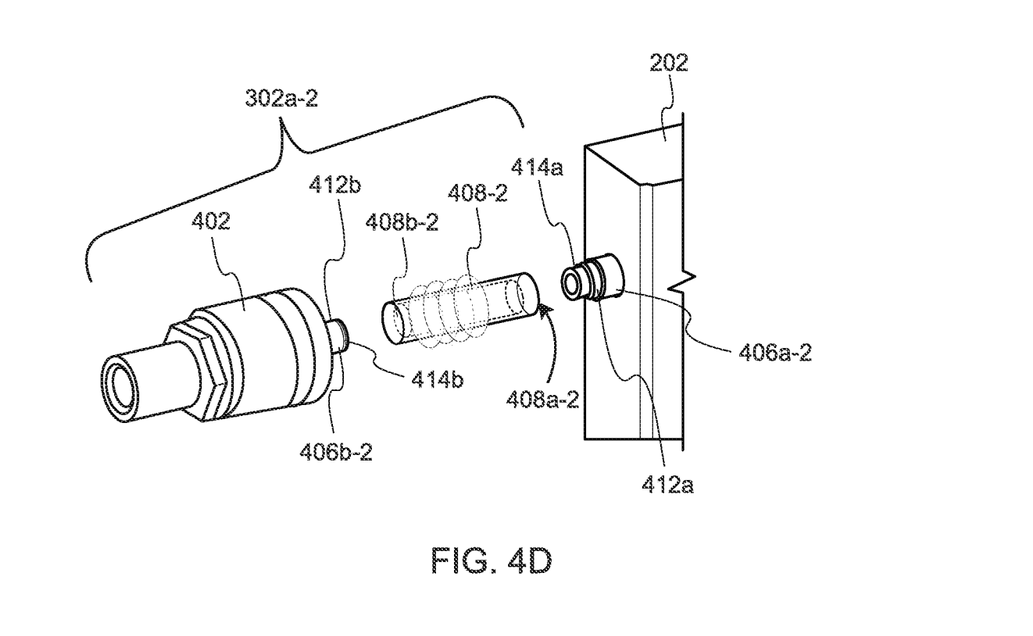
FIG. 4D illustrates a detailed perspective view of the connector assembly of FIG. 4C, according to one embodiment of the present disclosure.

For example, FIG. 4D illustrates a detailed perspective view of the connector assembly 302a-2 of FIG. 4C, according to one embodiment of the present disclosure. The first straight portion 406a-2 can include a threaded portion 412a that interfaces with a threaded portion 408a-2 of the flexible portion 408-2. Similarly, the second straight portion 406b-2 can include a threaded portion 412b that interfaces with a threaded portion 408b-2 of the flexible portion 408-2. The threaded portions 412a, 412b, 408a-2, and 408b-2 allow the flexible portion 408-2 to detach from the first straight portion 406a-2 and the second straight portion 406b-2.

The first straight portion 406a-2 can also include a seal 414a for making a liquid-tight connection between the first straight portion 406a-2 and the flexible portion 408-2. The second straight portion 406b-2 can also include a seal 414b for making a liquid-tight connection between the second straight portion 406b-2 and the flexible portion 408-2. Alternatively, the flexible portion 408-2 can include one or both of the seals 414a and 414b, or additional seals.

Although described as being part of the connector assembly 302a-2, in one or more embodiments, the second straight portion 406b-2 can instead be considered part of the first connector 402. For example, if the second straight portion 406b-2 is integral with or formed as part of the first connector 402, the second straight portion 406b-2 can instead be considered an element of the first connector 402. In which case, the connector assembly 302a-2 instead includes the first straight portion 406a-2 and the flexible portion 408-2, similar to the connector assembly 302a of FIG. 4A.

Figure 5A:
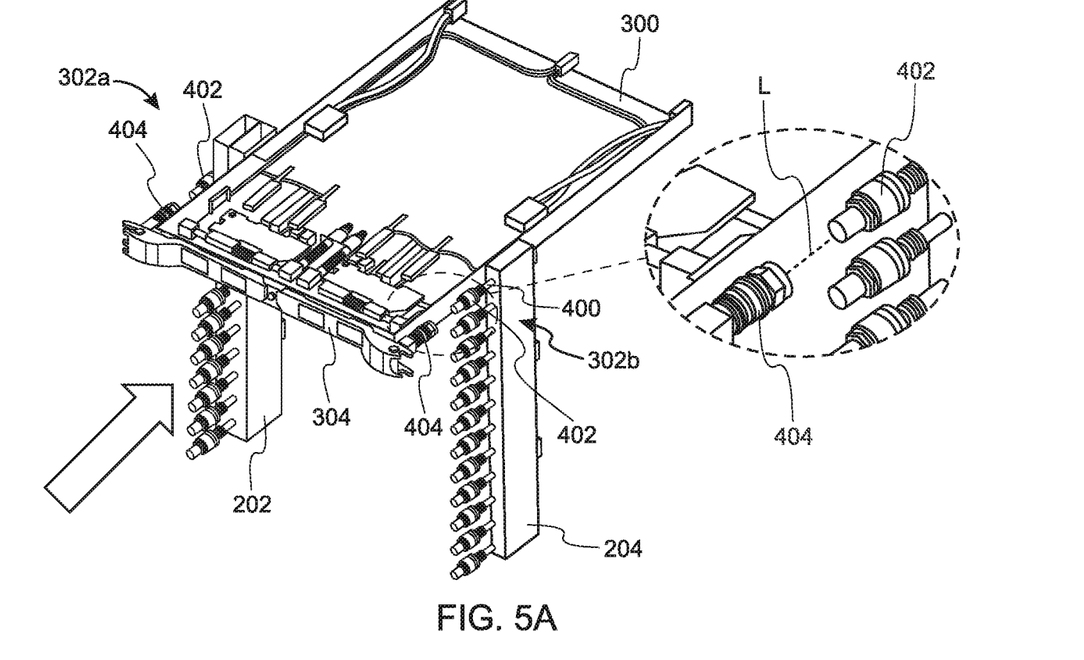
FIG. 5A illustrates a perspective view of fluidly connecting a component to the liquid cooling manifold, according to one embodiment of the present disclosure.
Figure 5B:
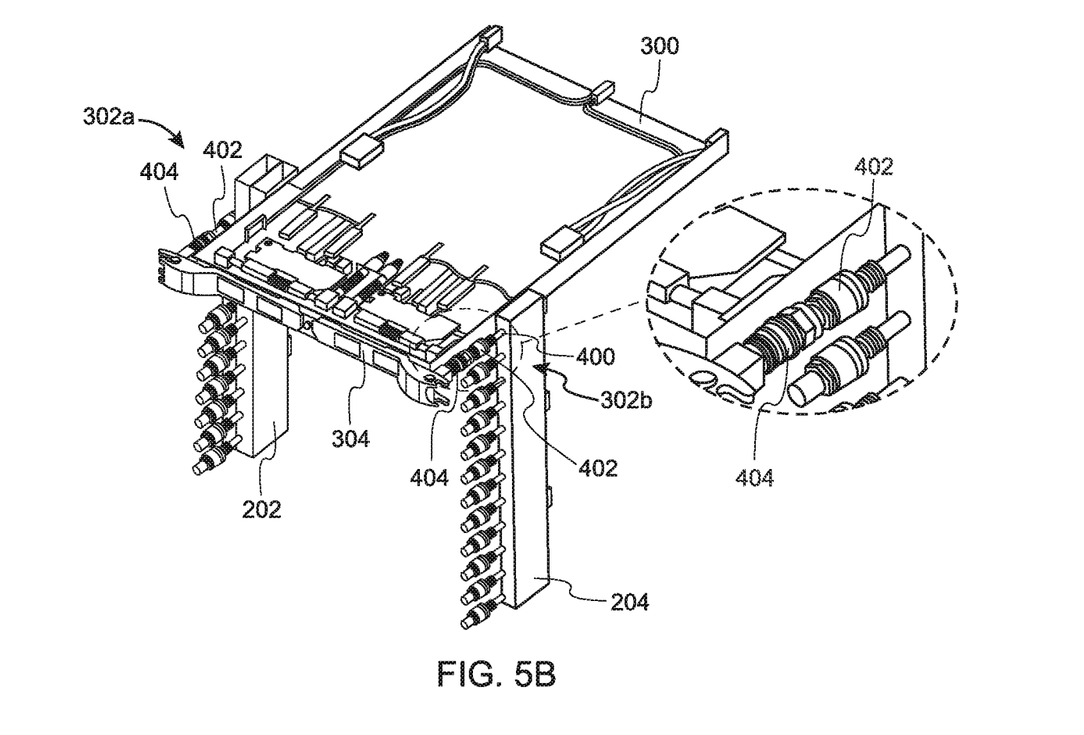
FIG. 5B illustrates a perspective view of the component of FIG. 5A connected to the liquid cooling manifold, according to one embodiment of the present disclosure.

FIG. 5A illustrates a perspective view of inserting the sled 300 into the liquid cooling manifold system 200, according to one embodiment of the present disclosure. FIG. 5B illustrates a perspective view of the sled 300 of FIG. 5A connected to the liquid cooling manifold system 200, according to one embodiment of the present disclosure. Referring to FIG. 5A, as the sled 300 is brought close to the liquid cooling manifold system 200, the second connectors 404 of the sled 300 are directed towards the first connectors 402 attached to the first liquid manifold 202 and the second liquid manifold 204. Because each connector assembly 302 includes the flexible portion 408, the pipe 400 can flex to assist in the alignment of the first connector 402 to the second connector 404.

Referring to FIG. 5B, after the first connectors 402 and the second connectors 404 couple together, the flexible portions 408 of the connector assemblies 302 (FIG. 3) can remain flexed, if needed. This allows the connector assemblies 302 to maintain a liquid-tight connection even if, for example, the cumulative tolerances of the system as a whole result in the first connectors 402 and the second connectors 404 initially not aligning. The connector assemblies 302 therefore allow the sled 300, or any component 104, to be quickly attached and detached from the liquid cooling manifold system 200 without leaking liquid coolant and without needing to precisely align the first connectors 402 and the second connectors 404 prior engagement, simply by inserting the component 104 into a slot 108. Moreover, the connector assemblies 302 provide a floating connection between the liquid cooling manifold system 200 and the components 104 that can tolerate movement of the components 104 relative to the liquid cooling manifold system 200, such as in the event of, for example, an earthquake on unintentional movement of the components 104.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A connector assembly for a liquid manifold within a server rack, the connector assembly comprising:
 a pipe configured to connect to the liquid manifold, the pipe having a flexible portion configured to accommodate at least one of lateral or vertical manipulation of the pipe while the pipe remains connected to the liquid manifold; and
 a first connector and a second connector configured to form a liquid-tight connection when coupled together, one of the first connector and the second connector being connected to a distal end of the pipe and the other of the first connector and the second connector being configured to connect to a component of a plurality of components within the server rack, for supplying coolant from the liquid manifold to the component,
 wherein a proximal end of the pipe is a straight portion that connects the pipe to the liquid manifold, and the flexible portion is at the distal end of the pipe.

2. The connector assembly of claim 1, wherein at least one of the first connector or the second connector is configured to self-seal when disconnected.

3. The connector assembly of claim 1, wherein the first connector is a female-type connector, and the second connector is a male-type connector.

4. The connector assembly of claim 1, wherein the second connector is connected to the distal end of the pipe, and the first connector is configured to connect to the component of the server rack.

5. The connector assembly of claim 1, wherein the first connector is connected to the distal end of the pipe, and the component is a sled of the server rack configured to retain a server computer system.

6. The connector assembly of claim 1, wherein the pipe is configured to extend perpendicularly away from the liquid manifold and parallel to an insertion direction of the component within the server rack.

7. A server rack for housing a server computer system, the server rack comprising:
 a rack frame having a slot;
 a sled configured to retain the server computer system and be inserted into the slot, the sled having a dock configured to fluidly connect to the server computer system;

a liquid cooling manifold system extending a height of the rack frame, the liquid cooling manifold system having a first liquid manifold and a second liquid manifold; and a first connector assembly being connected to the first liquid manifold and a second connector assembly being connected to the second liquid manifold, each of the first connector assembly and the second connector assembly having:
- a pipe configured to connect to the respective liquid manifold, the pipe having a flexible portion configured to accommodate at least one of lateral or vertical manipulation of the pipe while the pipe remains connected to the respective liquid manifold; and
- a first connector and a second connector configured to form a liquid-tight connection when coupled together, one of the first connector and the second connector being connected to a distal end of the pipe and the other of the first connector and the second connector being connected to the dock,
- wherein the sled being inserted into the slot causes the first connectors to couple with the second connectors, and form a liquid-tight connection to fluidly connect the dock to the liquid cooling manifold system, and
- wherein (1) a proximal end of the pipe is a straight portion that connects the pipe to the respective liquid manifold, and the flexible portion is at the distal end of the pipe, or (2) the pipe includes a first straight portion and a second straight portion, the first straight portion connecting the pipe to the respective liquid manifold and the second straight portion connecting the pipe to the one of the first connector and the second connector at the distal end of the pipe, wherein the flexible portion is between the first straight portion and the second straight portion.

8. The server rack of claim 7, wherein at least one of the first connector or the second connector is configured to self-seal when disconnected.

9. The server rack of claim 7, wherein the one of the first connector and the second connector connected to the distal end of the pipe is configured to self-seal when decoupled.

10. The server rack of claim 7, wherein the flexible portion is configured to accommodate lateral, vertical, and longitudinal manipulation of the pipe, while the pipe remains connected to the respective liquid manifold.

11. The server rack of claim 7, wherein the first liquid manifold and the second liquid manifold are on opposite sides of the rack frame.

12. The server rack of claim 11, wherein the first connector assembly and the second connector assembly are horizontally aligned with the slot.

13. The server rack of claim 7, wherein the rack frame has a plurality of the slot, and the liquid cooling manifold system has a plurality of the first connector assembly and a plurality of the second connector assembly along the length of the rack frame.

14. The server rack of claim 13, wherein pairs of the first connector assembly and the second connector assembly are horizontally aligned with a separate slot of the plurality of the slot.

15. The server rack of claim 7, wherein the pipes of the first connector assembly and the second connector assembly extend perpendicularly away from the first liquid manifold and the second liquid manifold.

16. The server rack of claim 7, wherein the pipe is configured to disconnect from the respective liquid manifold.

17. A connector assembly for a liquid manifold within a server rack, the connector assembly comprising:
- a pipe configured to connect to the liquid manifold, the pipe having a flexible portion configured to accommodate at least one of lateral or vertical manipulation of the pipe while the pipe remains connected to the liquid manifold; and
- a first connector and a second connector configured to form a liquid-tight connection when coupled together, one of the first connector and the second connector being connected to a distal end of the pipe and the other of the first connector and the second connector being configured to connect to a component of a plurality of components within the server rack, for supplying coolant from the liquid manifold to the component,
- wherein the pipe includes a first straight portion and a second straight portion, the first straight portion connecting the pipe to the liquid manifold and the second straight portion connecting the pipe to the one of the first connector and the second connector at the distal end of the pipe, wherein the flexible portion is between the first straight portion and the second straight portion.

18. The connector assembly of claim 17, wherein at least one of the first connector or the second connector is configured to self-seal when disconnected.

19. The connector assembly of claim 17, wherein the first connector is a female-type connector, and the second connector is a male-type connector.

20. The connector assembly of claim 17, wherein the second connector is connected to the distal end of the pipe, and the first connector is configured to connect to the component of the server rack.

21. The connector assembly of claim 17, wherein the first connector is connected to the distal end of the pipe, and the component is a sled of the server rack configured to retain a server computer system.

22. The connector assembly of claim 17, wherein the pipe is configured to extend perpendicularly away from the liquid manifold and parallel to an insertion direction of the component within the server rack.

* * * * *